US007490257B2

(12) United States Patent
Endo (10) Patent No.: US 7,490,257 B2
(45) Date of Patent: Feb. 10, 2009

(54) CLOCK DISTRIBUTOR FOR USE IN SEMICONDUCTOR LOGICS FOR GENERATING CLOCK SIGNALS WHEN ENABLED AND A METHOD THEREFOR

(75) Inventor: Nobuyuki Endo, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 337 days.

(21) Appl. No.: 11/216,080

(22) Filed: Sep. 1, 2005

(65) Prior Publication Data
US 2006/0049863 A1 Mar. 9, 2006

(30) Foreign Application Priority Data
Sep. 3, 2004 (JP) .............. 2004-256392

(51) Int. Cl.
*G06F 9/38* (2006.01)
(52) U.S. Cl. ............................................. 713/401
(58) Field of Classification Search ........... 713/40–601
See application file for complete search history.

(56) References Cited

U.S. PATENT DOCUMENTS 5,386,585 A * 1/1995 Traylor ................ 712/29
5,550,783 A * 8/1996 Stephens et al. ............ 365/233
5,883,907 A * 3/1999 Hoekstra .................... 714/784
5,920,600 A * 7/1999 Yamaoka et al. ............ 375/376
5,983,339 A * 11/1999 Klim ......................... 712/200
6,166,572 A * 12/2000 Yamaoka ................... 327/149
6,247,134 B1 * 6/2001 Sproch et al. .............. 713/320
6,363,465 B1 * 3/2002 Toda ......................... 711/169
6,385,710 B1 * 5/2002 Goldman et al. ........... 711/169
6,611,920 B1 * 8/2003 Fletcher et al. ............. 713/322
6,654,065 B1 * 11/2003 Sung ......................... 348/525
6,687,882 B1 * 2/2004 McElvain et al. ............ 716/3
6,772,278 B2 * 8/2004 Toda ......................... 711/105
7,065,665 B2 * 6/2006 Jacobson et al. ........... 713/400

FOREIGN PATENT DOCUMENTS

JP 2003-108259 4/2003

* cited by examiner

Primary Examiner—Abdelmoniem Elamin
(74) Attorney, Agent, or Firm—Rabin & Berdo, PC (57) ABSTRACT

A clock distributor circuit is provided which works with power consumption reduced in semiconductor logic circuitry including clock synchronous circuits. The clock distributor circuit includes clock generation circuits generating gated clock signals in response to a clock enable signal to supply clock synchronous circuits with the generated clock signals. It is thus possible to reduce the power that would otherwise consumed by the toggling of the clock signal. A clock distribution method therefore is also provided.

14 Claims, 10 Drawing Sheets

CLOCK DISTRIBUTOR FOR USE IN SEMICONDUCTOR LOGICS FOR GENERATING CLOCK SIGNALS WHEN ENABLED AND A METHOD THEREFOR

BACKGROUND OF THE INVENTION

1. Field of the Invention

The present invention relates to a clock distributor circuit, and more particularly to a clock distributor circuit that works with power consumption reduced for use in semiconductor logic circuitry including a clock synchronous circuit. The present invention also relates to a method for the same.

2. Description of the Background Art

Conventionally, logic circuits formed by system LSI (Large Scale Integration), such as a central processor unit (CPU) or digital signal processor (DSP), operative in response to a clock signal usually includes a clock synchronous circuit, which may be composed of flip-flop circuits. For those flip-flop circuits, a type of flip-flop circuit may be applicable which has its data input terminal D, clock input terminal C and data output terminal Q and controls clock synchronization in response to a clock signal inputted to the clock input terminal C. This clock signal is applied in common to all of the flip-flop circuits provided in the circuitry that need clock synchronous control, so that the clock synchronization is established for those circuits by the same clock signal.

Figure 8:
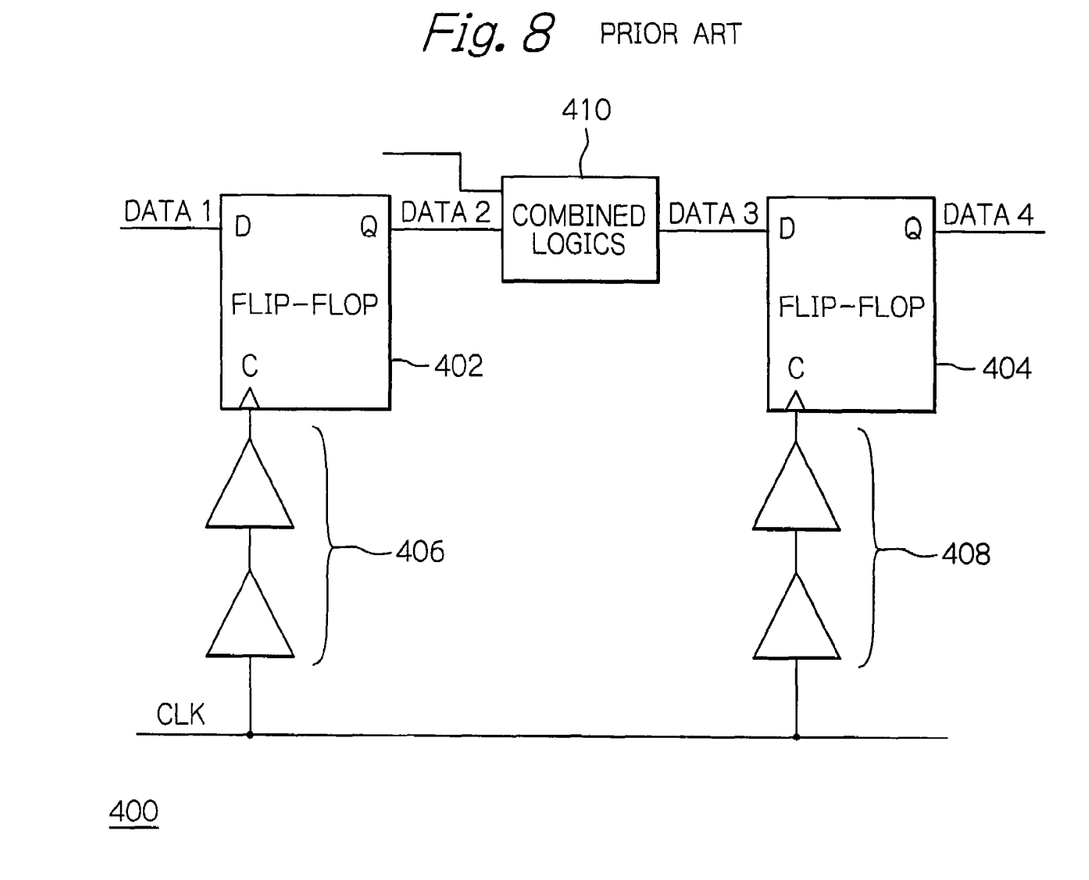
FIG. 8 is a schematic block diagram that shows a conventional clock distributor circuit.

As shown in FIG. 8, for example, a clock distributor circuit 400 to which such clock synchronous circuits are applied has flip-flop circuits 402 and 404 functioning as the clock synchronous circuits. The flip-flop circuits 402 and 404 are responsive to the clock signal CLK inputted via delay circuits 406 and 408, respectively, to control clock synchronization on data signals. In the illustrative clock distributor, the clock signal and the data signals are dealt with which have the waveforms thereof shown in FIG. 9.

Figure 9:
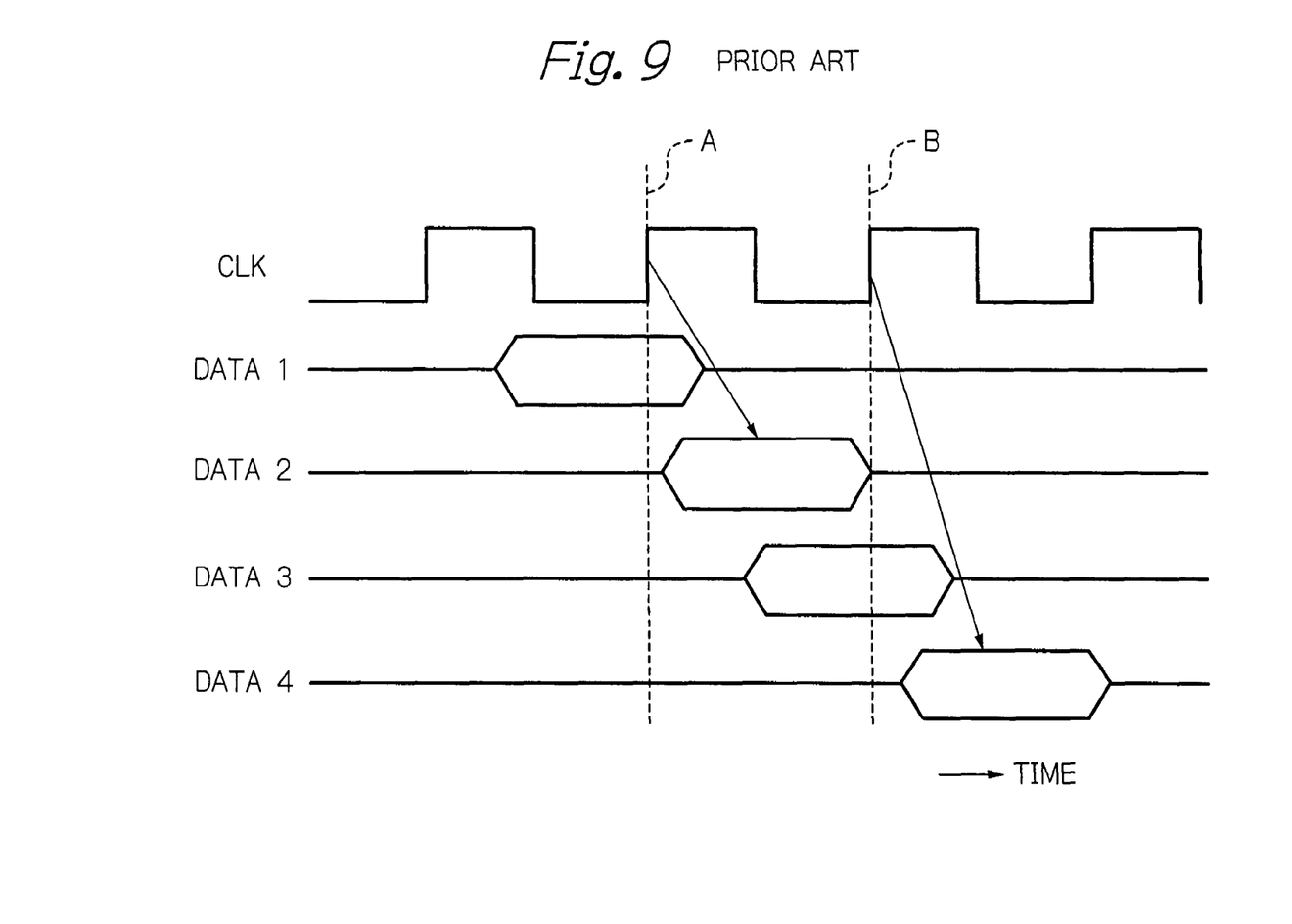
FIG. 9 is a timing chart that shows the waveforms appearing in the conventional clock distributor circuit shown in FIG. 8.

In the clock distributor circuit 400, first, the data signal DATA1 is inputted to the input terminal D of the flip-flop circuit 402. The flip-flop circuit 402 is responsive to the positive-going edge A of the clock signal CLK, as shown in FIG. 9, to take in the data signal DATA1 and output the output signal DATA2 in synchronism with the positive-going edge A from its output terminal Q. The output data signal DATA2 is operationally processed by the combined logics 410, and the resultant output data signal DATA3 is then delivered to the input terminal D of the flip-flop circuit 404. In the flip-flop circuit 404, as shown in FIG. 9, the data signal DATA3 is taken in in response to the positive-going edge B of the clock signal CLK, and the output signal DATA4 is outputted from the output terminal Q in synchronism with the positive-going edge B. As described above, in the clock synchronous circuit, a data signal is outputted from the preceding flip-flop in response to the positive-going edge of the clock signal CLK, and is operationally processed prior to the next positive-going edge, the operational result then being taken in by the following flip-flop in response to the next positive-going edge.

The clock signal CLK is thus supplied to all of the clock signal input terminals C of the flip-flop circuits provided in the clock distributor circuit 400. When this circuit is applied to a system logic, however, it operates in such a complex and diversified manner that the extensive space is required for the circuit in proportion to a remarkable increase of its circuit scale. Further, as the flip-flop circuits are distributed throughout in the circuit, they have different distances from the clock signal source. Therefore, between the input timings of the clock signal CLK to those flip-flop circuits, some differences in delay are involved, which are referred to clock skew. To reduce the clock skew, as shown in FIG. 8, each clock synchronous circuit is interconnected to a corresponding delay circuit to adjust the input timing of the clock signal CLK. For example, in order to reduce the clock skew, a delay circuit is provided which consists of fewer delay elements for the flip-flop circuit located farther from the clock signal source, whereas another delay circuit is provided consisting of more delay elements for the flip-flop circuit nearer to the clock signal source.

Figure 10:
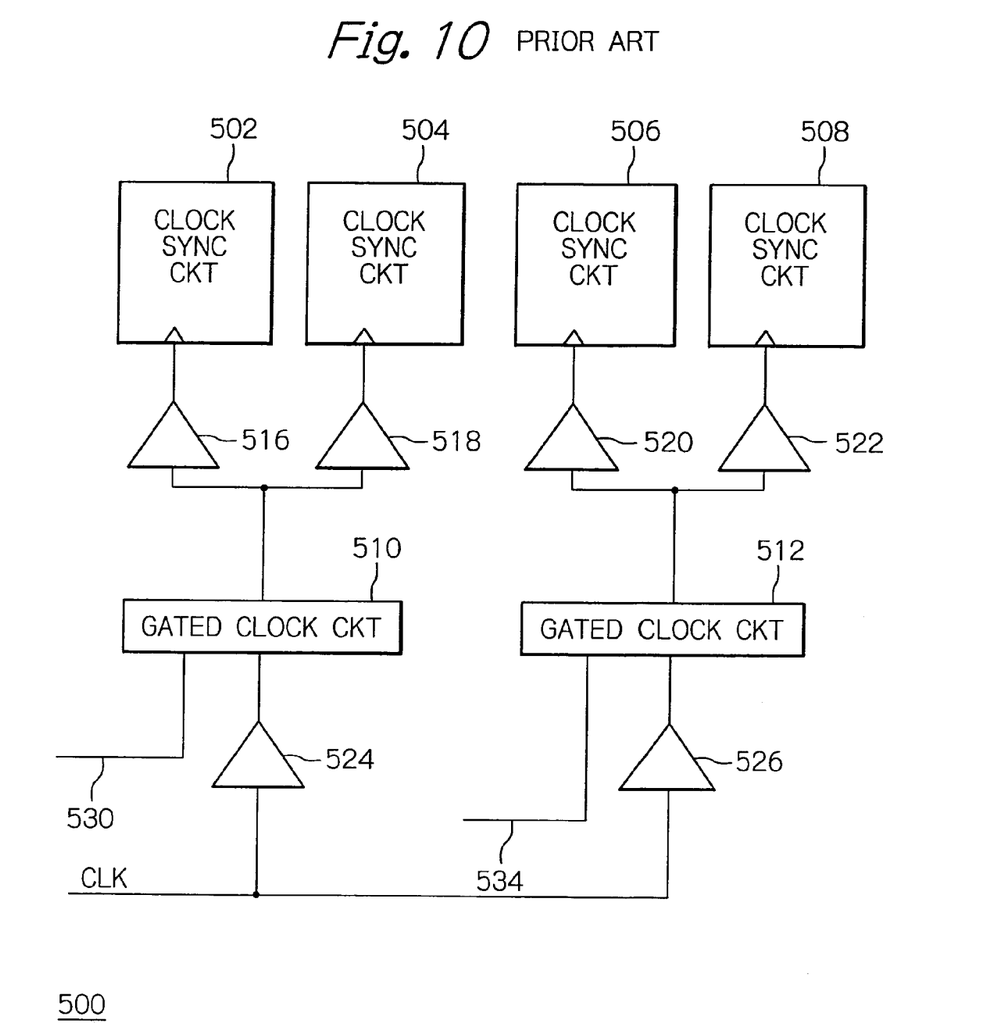
FIG. 10 is a schematic block diagram that shows a clock distributor circuit based upon a conventional clock gating method.

Further, since the clock signal CLK is always being supplied during the LSI logic circuit working, power is always consumed on the clock lines from the clock signal source to each clock signal input terminal. In order to reduce the power consumption, the clock gating method is used as a technique to halt the clock signal CLK supplied to unused circuits. As shown in FIG. 10, a clock distributor circuit 500 structured on the basis of the clock gating method is composed of the gated clock circuits 510 and 512 which are respectively connected to the one couple of clock synchronous circuits 502 and 504 and the other couple of clock synchronous circuits 506 and 508.

To the gated clock circuits 510 and 512, the clock signal CLK and the clock enable signals 530 and 534 are inputted. Only when the clock enable signal becomes enabled, each gated clock circuit generates the gated clock signal to supply it to the clock signal input terminals of the associated clock synchronous circuits. It is therefore able to reduce power consumption which would otherwise be caused by toggling of the clock signal supplied to circuits which are provided with the clock synchronous circuits but not operative.

In the clock distributor circuit 500 based upon the clock gating method like this, the gated clock circuits 510 and 512 may be provided with delay circuits 524 and 526 to adjust the input timing of the clock signal CLK. Also, the clock synchronous circuits 502, 504, 506 and 508 may respectively be provided with delay circuits 516, 518, 520 and 522 to adjust the input timing of the gated clock signal.

For example, an ordinary gated clock control circuit disclosed in Japanese patent laid-open publication No. 2003-108259 controls the output clock timing in response to the ordinary gated clock control signal. In the gated clock control circuit disclose, when an input clock signal g is inputted to the inverted clock terminal CK of the flip-flop circuit 10-3, FIG. 8 thereof, and the ordinary gated control signal e is inputted to the input terminal D, the output signal is outputted from the output terminal Q of the flip-flop circuit 10-3. In response to this output signal, the output clock signal X is outputted from the logical product circuit.

Also, in the gated clock control circuit like this, after a certain stable period has elapsed, the control signal h supplied to the reset terminal R of the flip-flop circuit 7 is made to be its logical "1", next the control signal f supplied to the logical product circuit 8 is made to be its logical "1" and then the ordinary gated clock control signal e is made to be its logical "1". In turn, the output clock signal i is outputted from the logical product circuit 9. Further, when the ordinary gated clock control signal e is made to be its logical "0", in response the output clock signal i is stopped, and then the control signals f and h are rendered to be its logical "0".

Therefore, if there is noise included in the input clock signal g at its start and/or stop point in time, the ill effect that would otherwise be caused by the noise can be prevented. It is thus able to start and stop the oscillator optionally, thus providing an information processing apparatus with low-power consumption.

In semiconductor logic circuits, however, a significant proportion of the power is generally consumed by the clock lines against the whole circuitry. For example, approximately 30 percent of the whole power is consumed by the toggling of the clock signal. Also in general, the power consumption in the delay circuits provided ahead of the gated clock circuits is approximately ten times as much as that of the delay circuits provided behind of the gated clock circuits because the toggling rate after the gated clock circuit is remarkably smaller than that before the gated clock circuit. Therefore, in order to reduce the power consumption more effectively, it is necessary to reduce the power consumed in the delay circuits provided ahead of the gated clock circuits.

SUMMARY OF THE INVENTION

It is an object of the present invention to provide a clock distributor circuit that works with power consumption more effectively reduced for use in semiconductor logic circuitry including a clock synchronous circuit, and a clock distribution method.

In accordance with the present invention, a clock distributor circuit comprises at least one clock synchronous circuit for receiving a data signal and output the data signal synchronized with a clock as an output signal, and at least one clock generating circuit for receiving a clock enable signal and generating, in response to the clock enable signal, a gated clock signal to output the gated clock signal. The at least one clock generating circuit is connected to the at least one clock synchronous circuit to supply the gated clock signals substantially simultaneously.

Further, in accordance with the present invention, a method of distributing a clock comprises at least one clock synchronous step of receiving a data signal and output the data signal synchronized with a clock as an output signal, and at least one clock generating step of receiving a clock enable signal and generating, in response to the clock enable signal, a gated clock signal to output the gated clock signal. The at least one clock generating step is associated with the at least one clock synchronous step to supply the gated clock signal substantially simultaneously.

With the clock distributor circuit according to the invention, the clock generator circuits, functioning as generators for generating gated clock signals, are adapted for receiving the enable signal instead of the clock signal. It is therefore possible to reduce the power that would otherwise consumed by toggling the clock signal. In addition, the power consumption encountered ahead, or upstream in the signal direction, of the gated clock circuits was approximately ten times as much as that encountered behind, or downstream in the signal direction, the gated clock circuits. However, considerable reduction of that power can be expected in accordance with the invention.

Further, in the clock distributor circuit according to the invention, the different clock generator circuits are adapted to receive clock enable signals different from each other. It is thus possible to supply clock enable signals different from each other to the clock synchronous circuits in dependence upon whether or not the clock synchronous circuits is rendered operative. That gives rise to reduction in power consumption which would otherwise be required for toggling the clock signal to be supplied to clock synchronous circuits rendered inoperable.

Furthermore, in the clock distributor circuit according to the invention, the clock generator circuits are adapted for synchronizing the gated clock signal in response to the gated clock synchronous signal. Even when the clock generator circuits are different in characteristics from each other to cause the periods to differ between the gated clock signals, it is also possible to prevent operational failures otherwise resultant from skew accumulated by repeated clock cycles.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
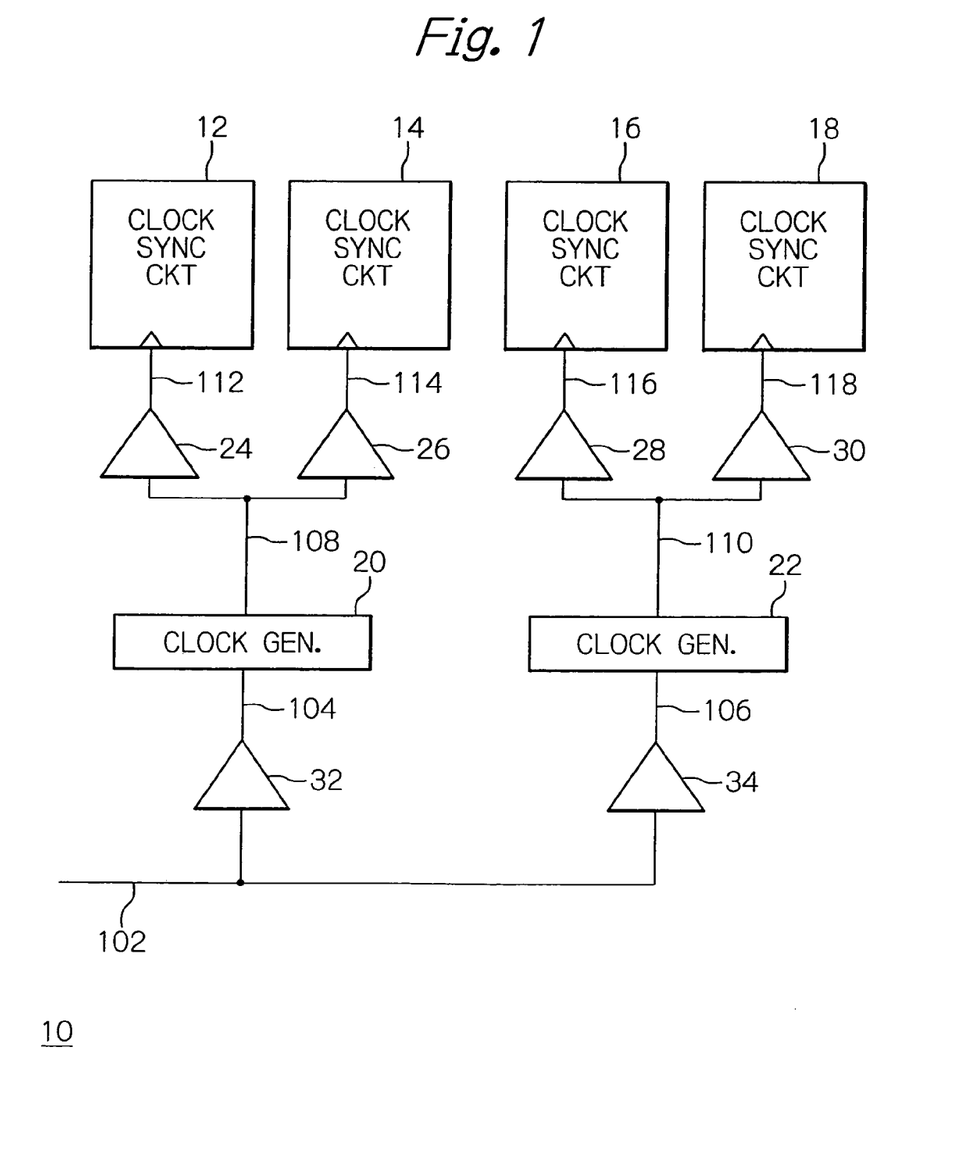
FIG. 1 is a schematic block diagram that shows an embodiment of the clock distributor circuit according to the invention.

In the following, the preferred embodiments of the clock distributor circuit according to the invention will be described in detail with reference to the accompanying drawings. As seen from in FIG. 1, for example, the clock distributor circuit 10 includes plural clock generator circuits 20 and 22, and is adapted to control the clock generators 20 and 22 in response to an enable signal 102. The clock generators 20 and 22 are adapted to supply plural clock synchronous circuits 12, 14 and 16, 18 with gated clock signals 108 and 110, respectively. In FIG. 1, the parts or components not directly relating to understanding the invention are not shown for simplification.

The clock distributor circuit 10 of the embodiment may include more clock synchronous circuits. FIG. 1 shows, however, only four clock synchronous circuits 12, 14, 16 and 18 for simplification. The clock distributor circuit 10 may also comprise more clock generator circuits. Also for simplification, however, only two clock generator circuits 20 and 22 are depicted in FIG. 1.

In the embodiment, the clock synchronous circuits 12, 14 and 16, 18 are adapted to receive data signals, not shown, and be responsive to the gated clock signals 108 and 110, respective to synchronize the inputted data signals with the clock.

The clock synchronous circuits may be implemented by, for example, flip-flop circuits, or any other logic components. In the embodiment, the clock synchronous circuits 12 and 14 control clock synchronization in response to the gated clock signal 108 supplied from the clock generator circuit 20, and the other clock synchronous circuit 16 and 18 control clock synchronization in response to the other gated clock signal 110 supplied from the clock generator circuit 22. Besides, the clock synchronous circuit 12, 14, 16 and 18 may be connected with each other by operational circuits, not shown, such as combined logic circuits.

Further, the clock synchronous circuits 12, 14, 16 and 18 have delay circuits 24, 26, 28 and 30, respective, interconnected for adjusting the skew of the gated clock signals supplied to them. The delay circuits 24 and 26 are adapted to adjust the clock skew of the gated clock signal 108 coming from the clock generator circuit 20 and supply the adjusted gated clock signals 112 and 114, respectively, to the clock synchronous circuit 12 and 14 at the same time. The other delay circuits 28 and 30 also adapted to adjust the clock skew of the gated clock signal 110 coming from the other clock generator circuit 22 and supply the adjusted gated clock signals 116 and 118, respectively, to the clock synchronous circuit 16 and 18 at the same time.

For example, when the circuit line from the source of the gated clock signal 108 to the clock synchronous circuit 12 is shorter in wiring length than to the other clock synchronous circuit 14, the clock synchronous circuit 12 may be provided with a delay circuit consisting of more delay elements than that of the other clock synchronous circuit 14 for adjusting the clock skew. Similarly, for the clock synchronous circuits 16 and 18, delay circuits may be provided which consist of delay elements corresponding in number to the wiring lengths from the source of the gated clock signal 110 for adjusting the clock skew.

In the embodiment, the clock generator circuits 20 and 22 are adapted to generate and distribute the gated clock signals in response to the clock enable signal 102 supplied to them. For example, they may be adapted not to output the gated clock signals when the clock enable signal is low but the gated clock signals with its level fixed high or low when the clock enable signal is high.

Figure 2:
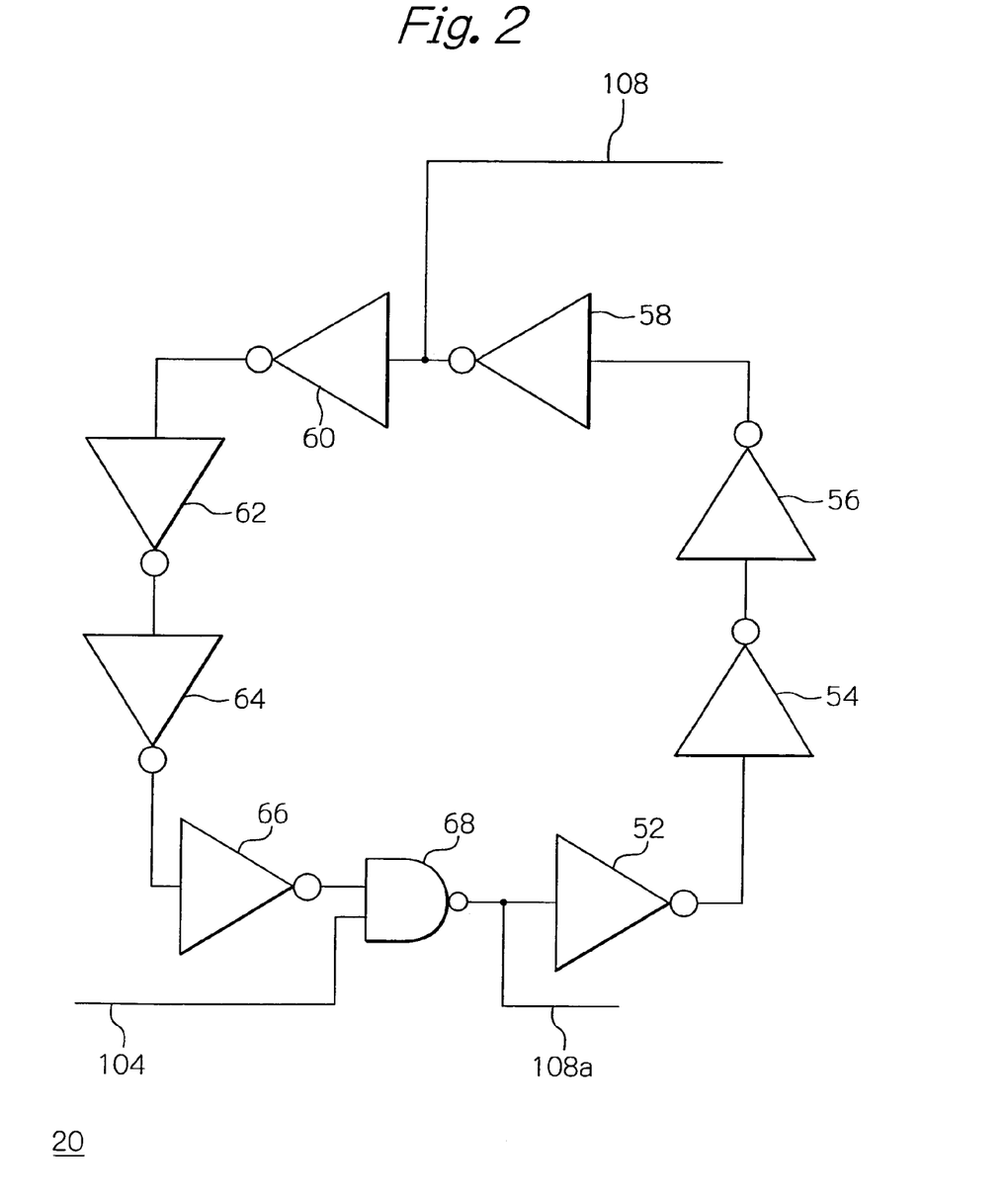
FIG. 2 is a schematic circuit diagram that shows an arrangement of the clock generator circuit included in the embodiment of the clock distributor circuit shown in FIG. 1.

The clock generator circuits 20 and 22 may be composed of a ring oscillator, as shown in FIG. 2, having plural inverters interconnected so as to form a ring. The clock generator circuits 20 and 22 may, for example, comprise an even number of NOT circuits 52-66 and a NAND circuit 68 interconnected annularly. For example, the clock generator circuit 20 has the NAND circuit 68 adapted to receive a clock enable signal 104 to output the gated clock signal 108, which is fixed to its high level when the clock enable signal 104 is low and clocks with its level alternately inverted, when the clock enable signal 104 is high, each time circulating along the ring. The gated clock signal 108 thus has its clock period twice as long as the delay time encountered along one circulation of the ring oscillator.

The clock generator circuit 20 shown in FIG. 2 is adapted to develop the gated clock signal 108 from the output of the NOT circuit 58, which is positioned in the middle of the series of NOT circuits and even numbered from the NAND circuit 68. Alternatively, as depicted with the reference numeral 108*a*, the gated clock signal 108 may be taken out from the output of the NAND circuit 68 to thereby reduce the clock skew caused by the ring oscillator.

The clock generator circuits 20 and 22 of the embodiment are provided with respective delay circuits 32 and 34 for adjusting the skew of the clock enable signal 102 supplied thereto. The delay circuits 32 and 34 may be adapted to adjust the skew in such a fashion that the timing at which the clock enable signal 102 supplied to the clock generator circuits 20 and 22 becomes enabled is timed with the clock signal. The delay circuits 32 and 34 may advantageously consist of delay elements, of which the number corresponds to the wiring length from the source of the clock enable signal 102 to the clock generator circuits 20 and 22, respectively, for adjusting the clock skew. For example, when the wiring length from the source of the clock enable signal 102 to the clock generator circuit 20 is shorter than the wiring length to the clock generator circuit 22, the delay circuit comprising more delay elements may be provided for the clock generator circuit 22 than the other clock generator circuit 20 for adjusting the clock skew.

Figure 3:
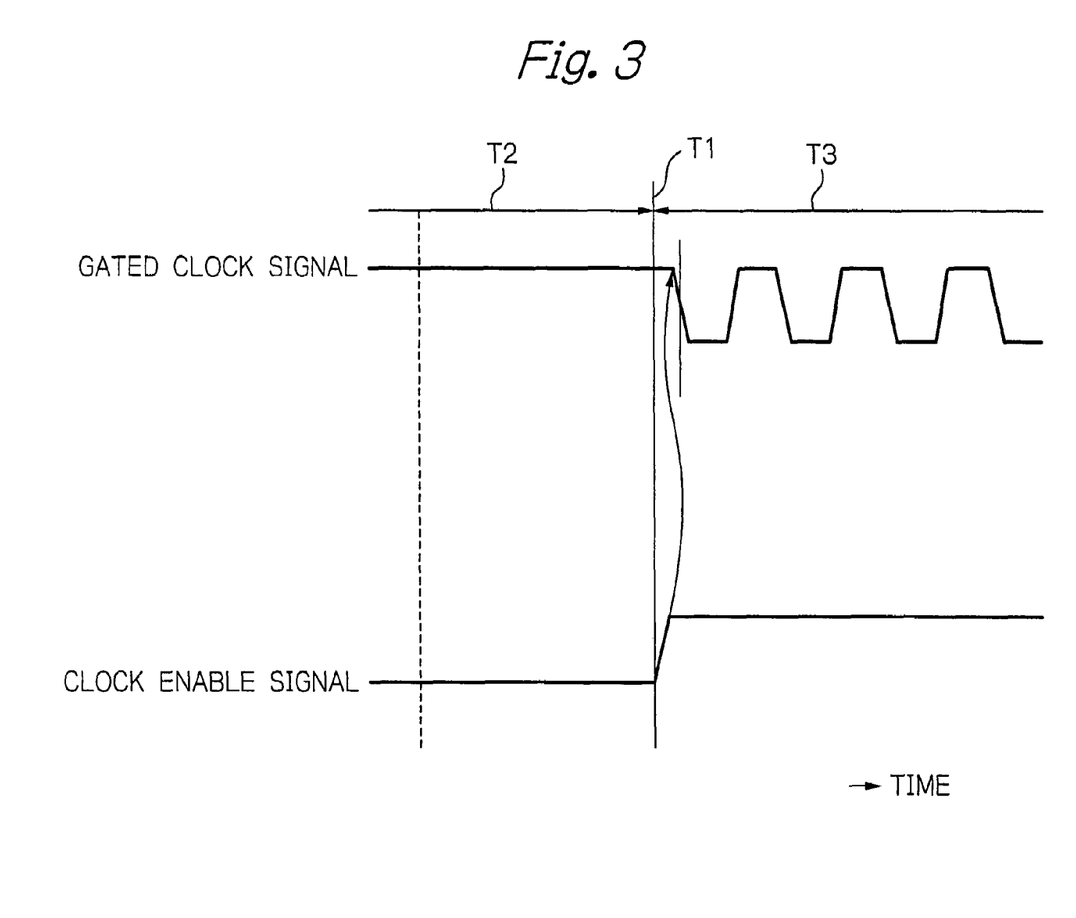
FIG. 3 is a timing chart that shows the waveforms appearing in the clock generator circuit included in the embodiment shown in FIG. 1.

Next, the operation of the clock distributor circuit 10 of the embodiment will be described with reference to the timing chart shown in FIG. 3. In the embodiment, first, during the working period T2, the low level clock enable signal 102 is supplied to the clock generator circuits 20 and 22 via the delay circuits 32 and 34. In the clock generator circuits 20 and 22, during that period the clock enable signal 102 has its low level, and the gated clock signal at the NAND circuit 68 keeps its initial state, i.e. high level. The gated clock signals 108 and 110 having the high level thereof are therefore outputted as they are.

In the embodiment, the gated clock signal 108 from the clock generator circuit 20 is supplied to the clock synchronous circuits 12 and 14 via the delay circuits 24 and 26, respectively, and the other gated clock signal 110 from the clock generator circuit 22 is supplied to the other clock synchronous circuits 16 and 18 via the delay circuits 28 and 30, respectively.

In that period, the clock synchronous circuits 12, 14, 16 and 18 receive the gated clock signals supplied thereto and kept in their levels high and have no edges, so that they do not take in data signals when arriving nor output signals.

Next, at the time T1, the high level clock enable signal 102 is supplied to the clock generator circuits 20 and 22 through the delay circuits 32 and 34, respectively. In the clock generator circuits 20 and 22, the clock enable signal 102 and the gated clock signal at the NAND circuit 68 are high in level, so that the clock generator circuits 20 and 22 switch the gated clock signals 108 and 110 to the low level thereof and output the thus switched signals. At the next cycle, the gated clock signal at the NAND circuit 68 shifts to its low level with the clock enable signal 102 kept in its high level, and thus the gated clock signals 108 and 110 are switched to the high level thereof to be outputted. During the working period T3, the clock generator circuits 20 and 22 thus develop the gated clock signals 108 and 110 which clock with their levels changing from high to low or vice versa alternately at each cycle of the ring oscillator.

During the working time T3, the gated clock signals 108 and 110 thus clocking are supplied to the clock synchronous circuits 12, 14, 16 and 18 via the delay circuits 24, 26, 28 and 30, respectively. In response to the gated clock signals, the clock synchronous circuits 12, 14, 16 and 18 take in the arriving data signals at the timing of their positive-going edges, for example, and output them.

As described above, in the embodiment, the clock synchronous circuits can control the synchronization without dealing with a clock signal, thus effectively reducing power consumption otherwise caused by the toggling of the clock signal.

Further, in the clock generator circuits 20 and 22 of the embodiment, the generating timing of the gated clock signals 108 and 110 thus clocking is associated with the timing at which the clock enable signal is switched over to its high level. Therefore, in order to have the gated clock signal, supplied to each clock synchronous circuit, timed with desired timing, the delay circuits 32 and 34 may be adapted to adjust the clock skew of the timing at which the clock enable signal 102 supplied to each clock generator circuit is rendered enable.

Besides, the gated clock signal thus clocking is generated so that, particularly, its first cycle is synchronized with the timing at which the clock enable signal is switched over to its enable level. That causes, when the gated clock signals substantially simultaneously generated by the different clock generator circuits initially accord in clock skew with, but even slightly differ in frequency from, each other, the skews, when clocking repetitively, become set off from each other. It is therefore preferable to make the gated clock signals generated as identical in frequency as possible between those clock generator circuits.

It is also preferable that all of the plural clock generator circuits are identical in layout to each other and arranged not to be susceptible to noise interferences caused by circuits and wiring surrounding them.

Figure 4:
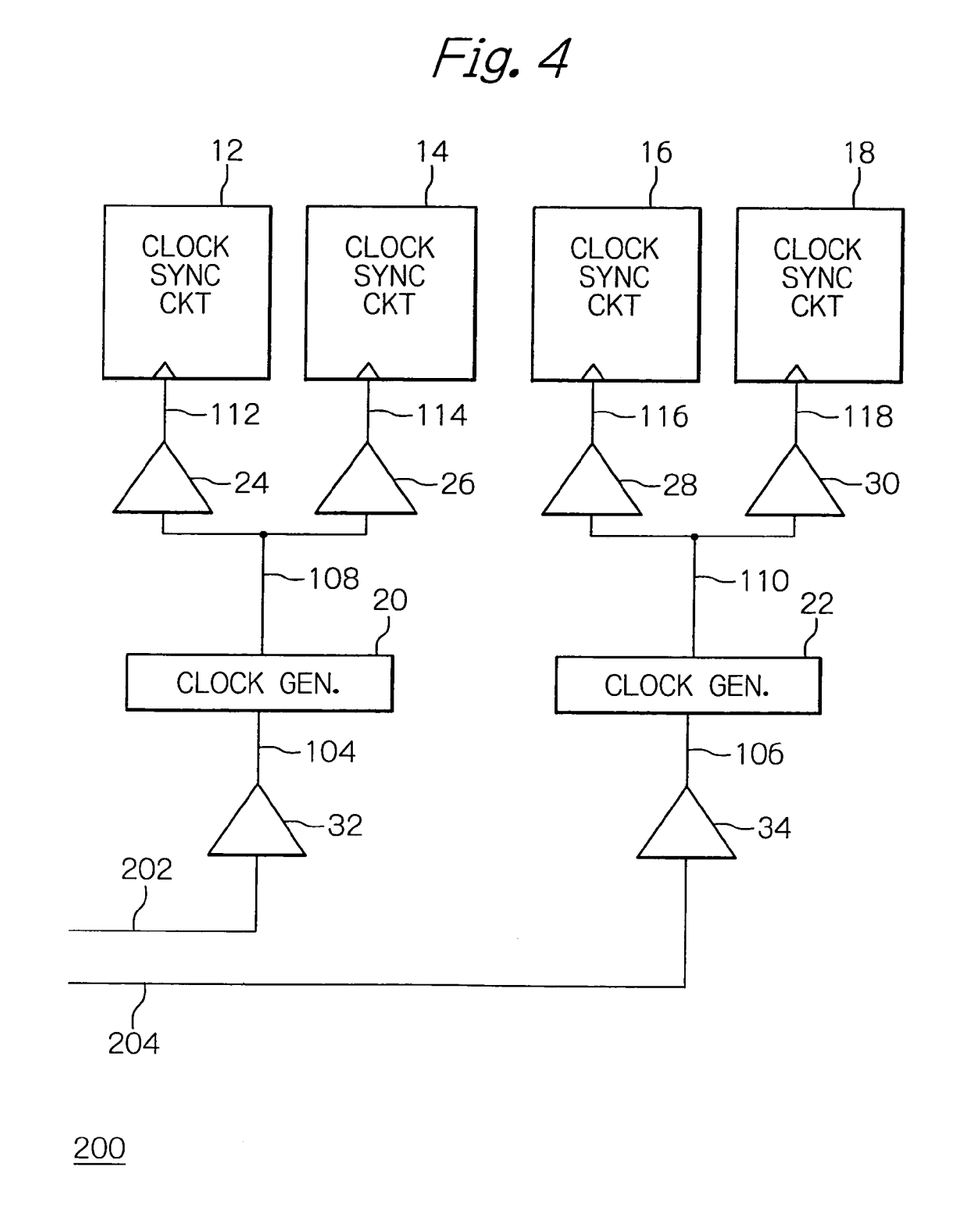
FIG. 4 is a schematic diagram that shows another embodiment of the clock distributor circuit according to the invention.

Next, an alternative embodiment of the invention will be described. As shown in FIG. 4, the clock distributor circuit 200 is adapted to receive plural kinds of clock enable signals 202 and 204 by the plural clock generator circuits 20 and 22, respectively, to be thereby able to generate the gated clock signals 108 and 110 at timings different from each other. In the specification, like components are designated with the same reference numerals.

In the clock distributor circuit 200, for example, when a high-level clock enable signal 202 and a low-level clock enable signal 204 are supplied at the same time to the clock generator circuits 20 and 22, respectively, the clock generator circuit 20 on one hand generates the gated clock signal 108 that works as a clock to operate the clock synchronous circuits 12 and 14 connected thereto, and the clock generator circuit 22 on the other hand outputs the high-fixed gated clock signal 110 to halt the operation of the other clock synchronous circuits 16 and 18 connected to the latter.

More specifically, the clock distributor circuit 200 is adapted not to supply the gated clock signal to unused ones of the clock synchronous circuits in operation. For example, the clock generators 20 and 22 are adapted to selectively connect ones of the clock synchronous circuits to be rendered substantially simultaneously operable.

Thus, the clock distributor circuit 200 is constituted by logic circuitry responsive to the clock enable signals supplied thereto. The logic circuitry may comprise clock generator circuits, one of which supplies the gated clock signal to the clock synchronous circuits to be rendered operable and the other supplies the gated clock signal to the clock synchronous circuits inoperable.

Further, the clock distributor circuit 200 may have plural processing steps with the clock enable signals made different from one to another processing step. For example, in the first processing step, the high-level gated clock signals 202 and 204 are supplied to both of the clock generator circuits 20 and 22, and in the second processing step, the high-level gated clock signal 202 is supplied to the one clock generator circuits 20 while the low-level gated clock signal 204 is supplied to the other clock generator circuits 22.

The clock synchronous circuit 200 is thus able to reduce power consumption that would otherwise be caused by the toggling of the gated clock signal supplied to the non-working clock synchronous circuits.

Figure 5:
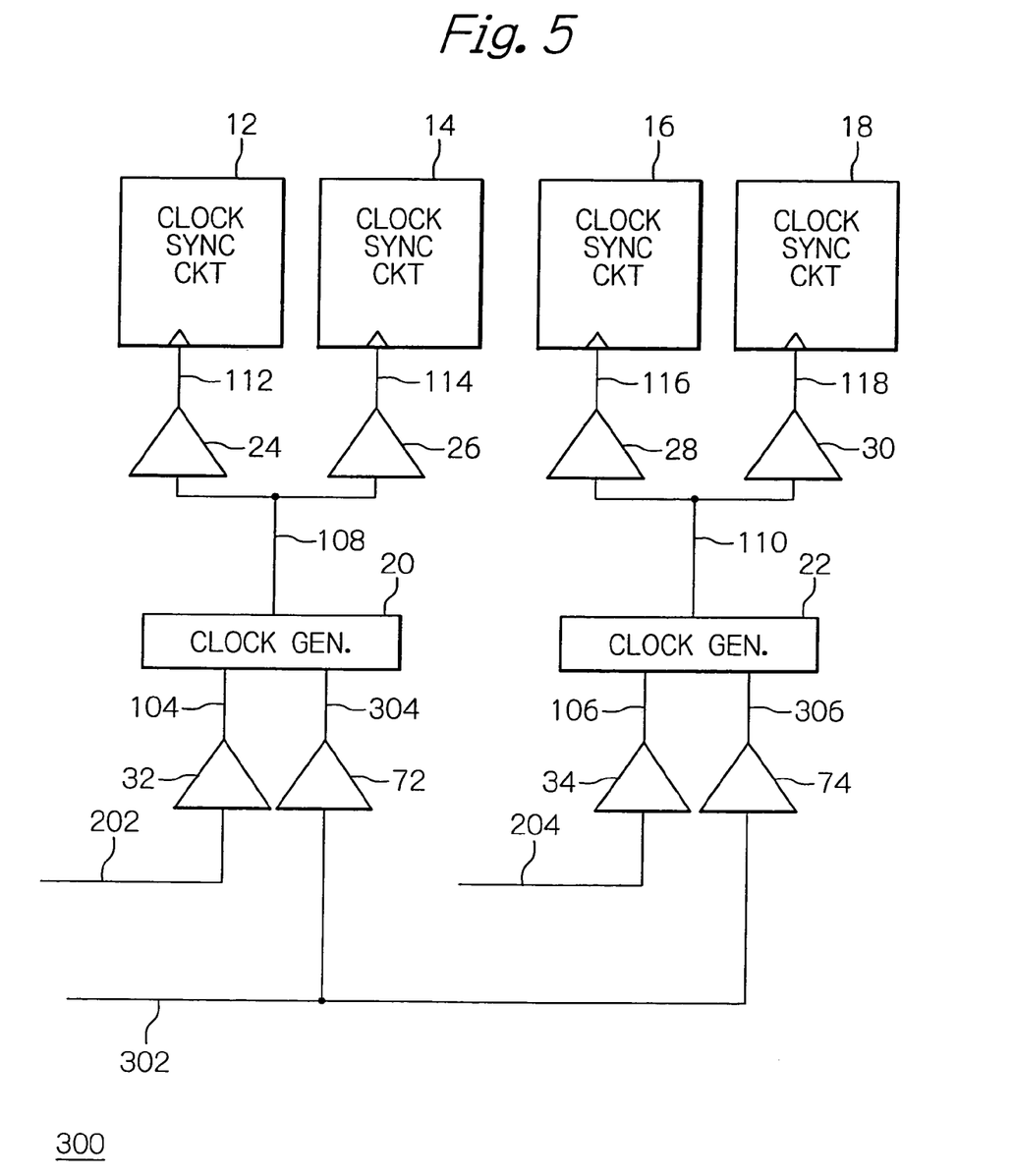
FIG. 5 is a schematic block diagram, like FIG. 1, showing an alternative embodiment of the clock distributor circuit according to the invention.

A still alternative embodiment of the invention will now be described. As shown in FIG. 5, the clock distributor circuit 300 is adapted to substantially simultaneously receive different clock enable signals 202 and 204 by the plural clock generator circuits 20 and 22, respectively. The clock distributor circuit 300 has its input terminal for receiving the gated clock synchronous signal 302, the gated clock synchronous signals 304 and 306 being supplied to the clock generator circuits 20 and 22, respectively.

Figure 6:
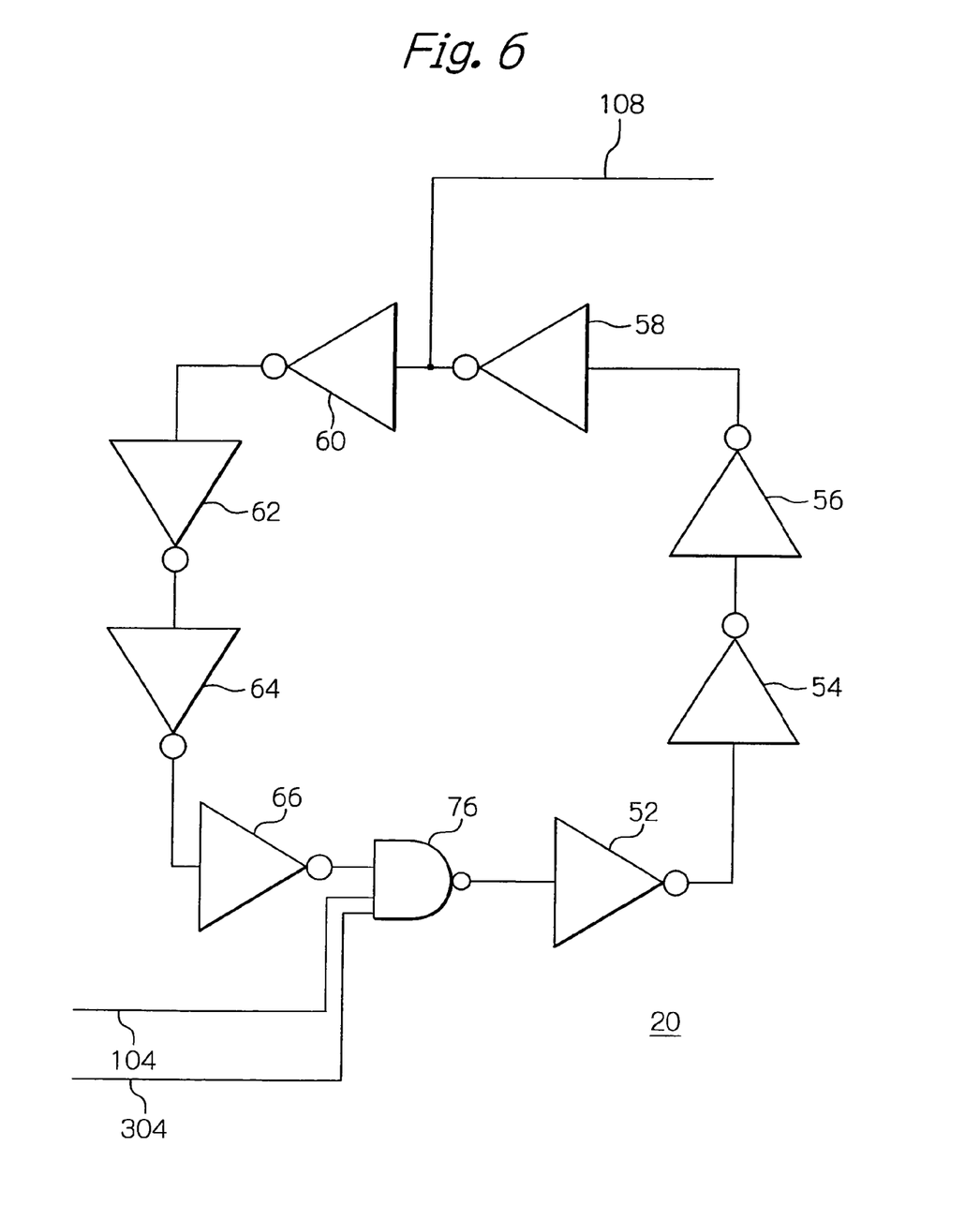
FIG. 6 is a schematic circuit diagram, like FIG. 2, showing an arrangement of the clock generator circuit included in the alternative embodiment of the clock distributor circuit shown in FIG. 5.

The clock generator circuits 20 and 22 may be of a ring oscillator shown in FIG. 6, in which plural inverters are connected to form a ring. The clock generator circuit 20, for example, is adapted to receive by the NAND circuit 76 the clock enable signal 104 and the gated clock synchronous signal 304 to produce the gated clock signal 108, which has its level fixed high when the clock enable signal 104 is low and alternately inverting, when the clock enable signal 104 is high, at each circulation of the ring to serve as a clock. The clock generators 20 and 22 are thus responsive to the gated clock synchronous signal 304 to cancel the skew cumulatively involved in the gated clock signal 108.

The clock generator circuits 20 and 22 are designed to generate the gated clock signals 108 and 110, respectively, to be synchronized with the timing at which the clock enable signals 104 and 108 are shifted to their enable level. Therefore, if the gated clock signals generated by different clock generator circuits differ in frequency from each other, the skew between the gated clock signals would then have been accumulated through the clock cycles. The clock distributor circuit 300 of the instant embodiment is, however, adapted for renewing the gated clock signals 108 and 110 at each predetermined number of cycles of the gated clock synchronous signal 302, thus cancelling the accumulated skew.

Figure 7:
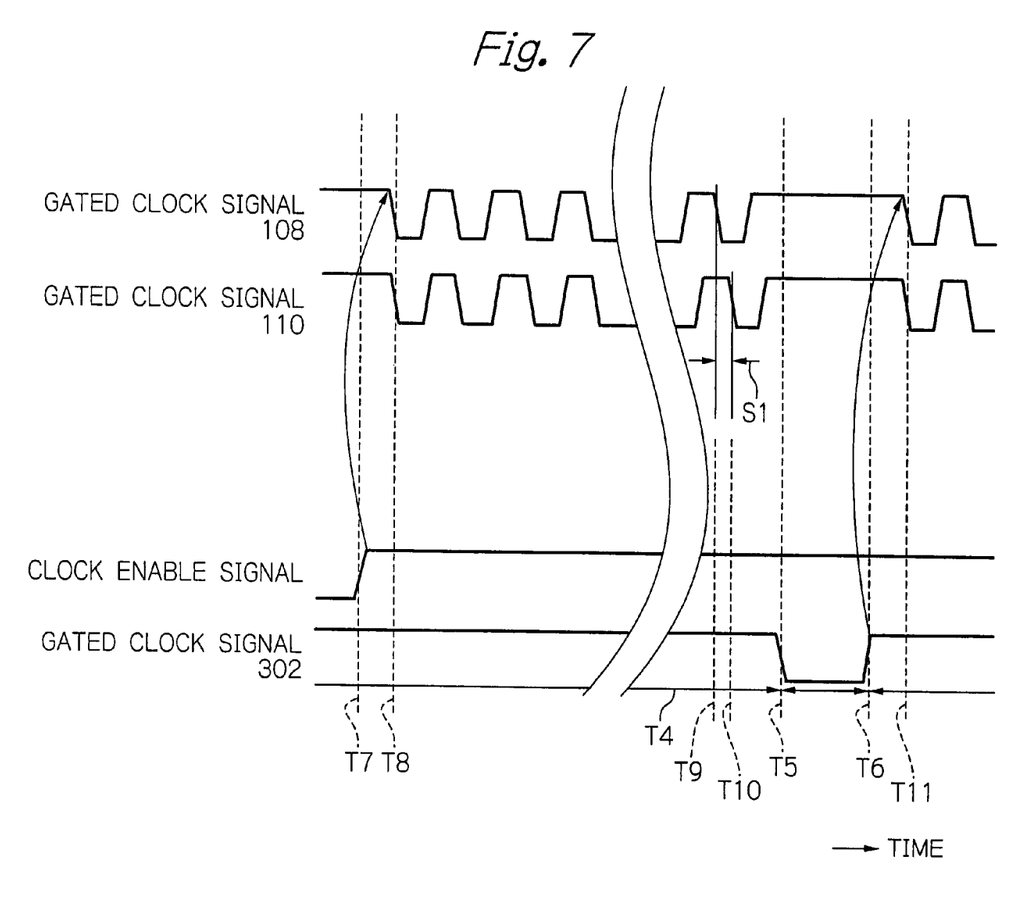
FIG. 7 is a timing chart, like FIG. 3, showing the waveforms appearing in the clock generator circuit included in the alternative embodiment shown in FIG. 5.

Well, the operation of the clock distributor circuit 300 of the instant alternative embodiment will be described with reference to the timing chart shown in FIG. 7. As shown in the figure, the gated clock synchronous signal 302 supplied to the clock distributor circuit 300 takes the waveform that keeps its level high during the predetermined period T4, then changes its level to low at the time T5 and returns its level to high at the time T6, and repeats the way of switching. The duration of the period T4, in which the gated clock synchronous signal 302 is high, is preferably set shorter than the time length corresponding to the difference of the skew accumulated in the gated clock signal over a range tolerable for the skew of the clock signal supplied to flip-flop circuit.

In the clock generator circuits 20 and 22, first, the clock enable signals 104 and 106 respectively supplied thereto are switched to their high levels at the time T7, and then the gated clock signals 108 and 110 are generated at the time T8. At the latter time, the high-level gated clock synchronous signals 304 and 306 respectively inputted to the clock generator circuits 20 and 22, however, do not affect the generation of the gated clock signals 108 and 110.

Between the gated clock signals 108 and 110 generated by the clock generator circuits 20 and 22, the difference of timing is accumulated and grows little by little through the clock cycles. For example, the gated clock signal 108 supplied from the one clock generator circuit 20 goes positive at the time T9 whereas the gated clock signal 110 supplied from the other clock generator circuit 22 goes positive at the time T10, the accumulated skew S1 from the time T9 being thus involved.

At the time T5, the gated clock synchronous signals 304 and 306 are switched to the low level thereof. The clock generator circuits 20 and 22 generate the gated clock signals 108 and 110, respectively, not clocking but fixed in the high level thereof.

At the following time T6, the gated clock synchronous signals 304 and 306 are switched to the high level thereof. The clock generator circuits 20 and 22 are synchronized with the timing of this switching to produce at the time T11 the gated clock signals 108 and 110 alternately switching the level thereof to serve as a clock.

As described above, the clock distributor circuit 300 of the alternative embodiment is provided with characteristics different from one to another clock generator. That gives rise to preventing, even when the gated clock signals generated are different in frequency from each other, operational failures that would otherwise be resultant from accumulated skew caused by repetitive clock cycles.

The entire disclosure of Japanese patent application No. 2004-256392 filed on Sep. 3, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A clock distributor circuit, comprising:
   a first synchronous circuit for receiving a first data signal and outputting the first data signal synchronized with a first gated clock signal as a first output signal;
   a first clock generating circuit for receiving a first clock enable signal and generating the first gated clock signal in response to the first clock enable signal, the first gated clock signal being supplied to the first synchronous circuit;
   a first delay circuit for adjusting a timing at which the first clock enable signal is received by the first clock generating circuit;
   a second synchronous circuit for receiving a second data signal and outputting the second data signal synchronized with a second gated clock signal as a second output signal;
   a second clock generating circuit for receiving a second clock enable signal and generating the second gated clock signal, in response to the second clock enable signal, the second gated clock signal being supplied to the second synchronous circuit; and
   a second delay circuit for receiving the second clock enable signal and providing the second clock generating circuit with the second clock enable signal.

2. The clock distributor circuit in accordance with claim 1, wherein each of the first and second clock generating circuits comprises a ring oscillator including a plurality of inverters interconnected in a form of ring.

3. The clock distributor circuit in accordance with claim 1, further comprising additional delay circuits for adjusting a timing at which the first and second gated clock signals are received by the first and second synchronous circuits.

4. The clock distributor circuit in accordance with claim 1, wherein the first and second clock generating circuits additionally receive a gated clock synchronous signal and are responsive to the gated clock synchronous signal to cancel skew.

5. The clock distributor circuit in accordance with claim 4, further comprising at least one delay circuit for adjusting a timing at which the gated clock synchronous signal is received by at least one of the first and second clock generating circuits.

6. A clocking method, comprising the steps of:
   (a) receiving a first clock enable signal and generating a first gated clock signal in response to the first clock enable signal;
   (b) receiving a first data signal and outputting the first data signal synchronized with the first gated clock signal as a first output signal;
   (c) receiving a second clock enable signal and generating a second gated clock signal in response to the second clock enable signal;
   (d) receiving a second data signal and outputting the second data signal synchronized with the second gated clock signal as a second output signal; and
   (e) adjusting the timing at which the first and second gated clock signals are received in steps (b) and (c) so that the first and second output signals are substantially synchronized,
   wherein step (e) includes delaying at least one of the first and second clock enable signals.

7. The method in accordance with claim 6, wherein steps (a) and (c) are each conducted using a ring oscillator including a plurality of inverters connected in a form of ring.

8. The method in accordance with claim 6, wherein each of the steps (b) and (d) further comprises a delay substep of adjusting a timing at which the respective gated clock signal is received so as to substantially simultaneously receive the gated clock signals during steps (b) and (d).

9. The method in accordance with claim 6, wherein steps (a) and (c) further comprise receiving a gated clock synchronous signal and cancelling skew accumulated in the first and second gated clock signals in response to the gated clock synchronous signal.

10. The method in accordance with claim 9, wherein at least one of steps (a) and (c) comprises a substep of adjusting a timing at which the gated clock synchronous signal is inputted in at least one of steps (a) and (c).

11. A clock distributor circuit, comprising:
    a first synchronous circuit for receiving a first data signal and outputting the first data signal synchronized with a first gated clock signal as a first output signal;
    a first clock generating circuit for receiving a clock enable signal but not a clock signal and for generating the first gated clock signal in response to only the clock enable signal, the first gated clock signal being supplied to the first synchronous circuit;
    a second synchronous circuit for receiving a second data signal and outputting the second data signal synchronized with a second gated clock signal as a second output signal;
    a second clock generating circuit for receiving the clock enable signal but not a clock signal and for generating the second gated clock signal in response to only the clock enable signal, the second gated clock signal being supplied to the second synchronous circuit; and
    a delay element, the clock enable signal being supplied to the second clock generating circuit via the delay element,
    wherein the first and second clock generating circuits are supplied respectively to the first and second synchronous circuits substantially simultaneously.

12. The clock distributor circuit according to claim 11, further comprising another delay element, the second gated clock signal being supplied to the second synchronous circuit via the another delay element.

13. A clocking method, comprising:
(a) receiving a clock enable signal but not a clock signal and generating a first gated clock signal in response to only the clock enable signal;
(b) receiving a first data signal and outputting the first data signal synchronized with the first gated clock signal as a first output signal;
(c) receiving the clock enable signal but not a clock signal and generating a second gated clock signal in response to only the clock enable signal; and
(d) receiving a second data signal and outputting the second data signal synchronized with the second gated clock signal as a second output signal,
wherein the first and second output signals are output substantially simultaneously, and
wherein the clock enable signal is delayed before it is received in step (c).

14. The method in accordance with claim 13, further comprising delaying the second gated clock signal before conducting step (d).

* * * * *